US006606270B2

United States Patent
Mullarkey

(10) Patent No.: US 6,606,270 B2
(45) Date of Patent: *Aug. 12, 2003

(54) DEVICE AND METHOD FOR SUPPLYING CURRENT TO A SEMICONDUCTOR MEMORY TO SUPPORT A BOOSTED VOLTAGE WITHIN THE MEMORY DURING TESTING

(75) Inventor: Patrick J. Mullarkey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/162,354

(22) Filed: Jun. 3, 2002

(65) Prior Publication Data

US 2002/0149966 A1 Oct. 17, 2002

Related U.S. Application Data

(60) Continuation of application No. 09/873,823, filed on Jun. 4, 2001, now Pat. No. 6,452,842, which is a continuation of application No. 09/688,993, filed on Oct. 16, 2000, now Pat. No. 6,285,600, which is a continuation of application No. 09/407,614, filed on Sep. 28, 1999, now Pat. No. 6,134,152, which is a division of application No. 09/038,667, filed on Feb. 27, 1998, now Pat. No. 6,005,812.

(51) Int. Cl.[7] .............................................. G11C 7/00
(52) U.S. Cl. ................................. 365/189.01; 365/226
(58) Field of Search ............................ 365/189.01, 226

(56) References Cited

U.S. PATENT DOCUMENTS

| 5,418,754 A | 5/1995 | Sakakibara | 365/222 |
| 5,592,421 A | 1/1997 | Kaneko et al. | 365/189.09 |
| 5,594,273 A | 1/1997 | Dasse et al. | 257/620 |
| 5,594,694 A | 1/1997 | Roohparvar et al. | 365/201 |
| 5,644,250 A | 7/1997 | Ooishi | 326/16 |
| 5,726,944 A | 3/1998 | Pelley, III et al. | 365/226 |
| 5,818,258 A | 10/1998 | Choi | 326/83 |
| 6,005,812 A | * 12/1999 | Mullarkey | 365/189.09 |
| 6,134,152 A | 10/2000 | Mullarkey | 365/189.01 |
| 6,462,423 B1 | * 10/2002 | Akram et al. | 257/778 |

OTHER PUBLICATIONS 1.3.2 General Economic Factors, Structural and Economic Factors Affecting Volatility, p. 9.

* cited by examiner

*Primary Examiner*—M. Tran
(74) *Attorney, Agent, or Firm*—TraskBritt

(57) ABSTRACT

A Dynamic Random Access Memory (DRAM) device includes a bus for distributing a boosted voltage $V_{CCP}$ within the device. A conventional internal voltage regulator, ring oscillator, and charge pump help to boost the boosted voltage $V_{CCP}$ on the bus when the voltage $V_{CCP}$ falls below a preset minimum. During testing of the DRAM device, when the demand on the boosted voltage $V_{CCP}$ can be four or more times as much as it is under normal operating conditions, an external current source drives current $I_{CCP}$ into an unused bond pad, such as a no-connection (NC) or address signal bond pad. An NMOS transistor switch then connects this bond pad to the boosted voltage $V_{CCP}$ bus when a pump circuit controlled by the ring oscillator activates the switch. As a result, the external current augments the efforts of the internal charge pump to boost the voltage $V_{CCP}$ during testing, so there is no need to build the internal charge pump with oversized capacitors to handle the excessive $V_{CCP}$ demand during testing.

19 Claims, 3 Drawing Sheets

DEVICE AND METHOD FOR SUPPLYING CURRENT TO A SEMICONDUCTOR MEMORY TO SUPPORT A BOOSTED VOLTAGE WITHIN THE MEMORY DURING TESTING

CROSS-REFERENCE TO RELATED APPLICATIONS

This application is a continuation of application Ser. No. 09/873,823, filed Jun. 4, 2001, now U.S. Pat. No. 6,452,842 B2, issued Sep. 17, 2002, which is a continuation of application Ser. No. 09/688,993, filed Oct. 16, 2000, now U.S. Pat. No. 6,285,600 B1, issued Sep. 4, 2001, which is a continuation of application Ser. No. 09/407,614, filed Sep. 28, 1999, now U.S. Pat. No. 6,134,152, issued Oct. 17, 2000, which is a divisional of application Ser. No. 09/038,667, filed Feb. 27, 1998, now U.S. Pat. No. 6,005,812, issued Dec. 21, 1999.

BACKGROUND OF THE INVENTION

1. Technical Field

This invention relates in general to semiconductor memories, such as Dynamic Random Access Memories (DRAMs) and more specifically, to devices and methods for supplying current to semiconductor memories from external sources to support boosted voltages, such as wordline voltages and isolation gate voltages, within such memories while they are tested.

2. State of the Art

Dynamic Random Access Memories (DRAMs) typically include various circuitry that will only operate properly when supplied with a voltage (denoted "$V_{CCP}$") that is "boosted" above the supply voltage (denoted "$V_{CC}$"). Such circuitry includes, for example, wordlines, which require a boosted voltage $V_{CCP}$ to store a full $V_{CC}$ level in a memory cell, and isolation gates, which require a boosted voltage $V_{CCP}$ to pass a full $V_{CC}$ level along a digit line.

In order to supply the boosted voltage $V_{CCP}$, DRAMs typically include an internal charge pump that generates the boosted voltage $V_{CCP}$ on one or more capacitors. These capacitors are typically relatively large so they can supply sufficient current $I_{CCP}$ to meet any demands that may be made on the charge pump by the DRAM circuitry.

During DRAM compression-mode testing, the demand for current $I_{CCP}$ from the charge pump may be many times the demand for current $I_{CCP}$ during normal memory operations. This is because many more wordlines and isolation gates may be operated at the same time during compression-mode testing than during normal memory operations.

Consequently, DRAM designers typically find it necessary to provide a DRAM with a charge pump having capacitors of sufficient size to meet the increased demand for current $I_{CCP}$ experienced during compression-mode testing, despite the fact that much smaller capacitors would suffice for normal memory operations. As a result, DRAMs shipped to customers typically include charge pumps with capacitors many times the size required for even the most rigorous field applications. These over-sized capacitors unnecessarily occupy integrated circuit (IC) die "real estate," and thus can either limit the functional circuitry that can be provided in a DRAM, or necessitate a larger die than is desirable for a DRAM.

Therefore, there is a need in the art for a device and method for providing current $I_{CCP}$ to a DRAM or other semiconductor memory during testing without having to use a charge pump with over-sized capacitors.

SUMMARY OF THE INVENTION

A semiconductor device, such as a DRAM or other semiconductor memory, in accordance with this invention includes a conductor, such as a voltage bus, that distributes a boosted voltage (e.g., $V_{CCP}$) within the semiconductor device. Internal boosting circuitry, such as a voltage regulator, a ring oscillator, and a charge pump, boosts a voltage level on the conductor upon sensing that the voltage level has fallen below a minimum level, such as a preset minimum. A terminal of the semiconductor device, such as a bond pad, receives current from a current source external to the device, and a switching circuit conducts current received through the terminal to the conductor in response to the internal boosting circuitry sensing that the voltage level on the conductor has fallen below the minimum level. As a result, the external current augments the efforts of the internal boosting circuitry to boost the voltage level on the conductor, thereby providing the necessary support for the boosted voltage during times of peak demand, such as during testing, without the need to provide oversized capacitors, for example, in the internal boosting circuitry. The switching circuit itself may be based on one or more pump circuits controlling one or more NMOS transistor switches that conduct the external current to the conductor when activated.

In other embodiments of this invention, the semiconductor device described above may be incorporated into an electronic device, or may be fabricated on the surface of a semiconductor substrate, such as a semiconductor wafer.

In a further embodiment of this invention, a boosted voltage in a semiconductor device is supported by boosting the boosted voltage using an externally generated current when the boosted voltage falls below a minimum level. The boosted voltage may be boosted by, for example, sensing that the boosted voltage has fallen below the minimum level. A charge pump in the semiconductor device can then be driven to boost the boosted voltage above the minimum level, and a switching circuit in the semiconductor device can be driven to conduct the externally generated current to augment the boosting of the boosted voltage by the charge pump.

DETAILED DESCRIPTION OF THE INVENTION

Figure 1:
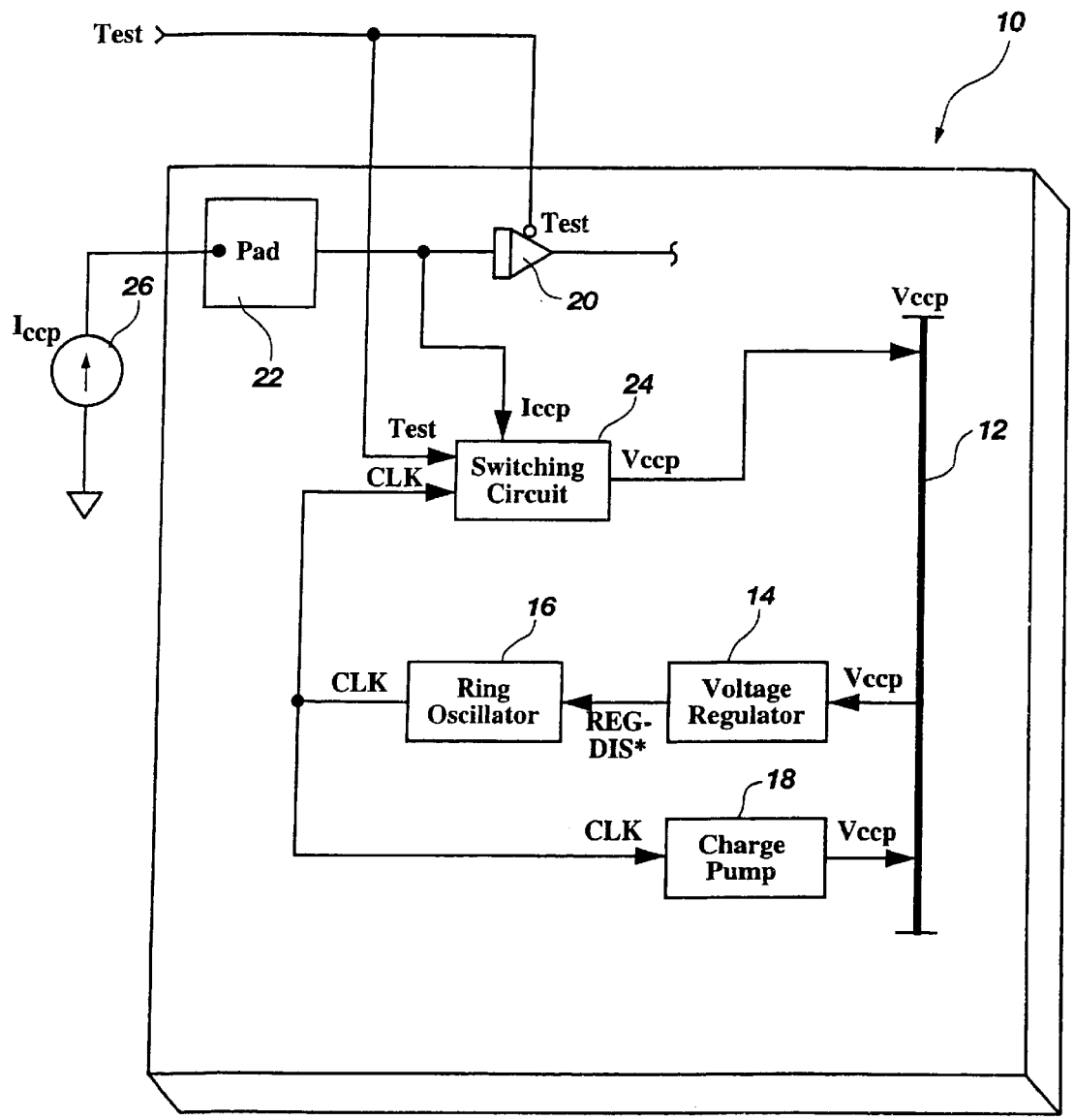
FIG. 1 is a block diagram of a Dynamic Random Access Memory (DRAM) device in accordance with this invention.

As shown in FIG. 1, a Dynamic Random Access Memory (DRAM) device 10 in accordance with this invention includes a boosted voltage $V_{CCP}$ bus 12 for distributing the boosted voltage $V_{CCP}$ within the DRAM device 10. Although this invention will be described with reference to the DRAM device 10, it will be understood by those having skill in the field of the invention that the invention includes a wide variety of semiconductor devices within its scope, and is not limited to DRAM devices.

While the DRAM device 10 is operating, a conventional voltage regulator 14 senses the level of the boosted voltage $V_{CCP}$ on the bus 12 and outputs an oscillator activation signal REGDIS* when the level of the boosted voltage $V_{CCP}$ drops below a preset minimum. In response to the oscillator activation signal REGDIS*, a conventional ring oscillator 16 outputs a clock signal CLK that activates a conventional charge pump 18. This causes the charge pump 18 to "boost" the level of the boosted voltage $V_{CCP}$ above the preset minimum until it reaches a preset maximum, at which point the voltage regulator 14 deactivates the oscillator activation signal REGDIS*, causing the ring oscillator 16 to deactivate the clock signal CLK and thereby deactivating the charge pump 18.

During testing, in particular compression-mode testing, a test signal TEST deactivates an input buffer 20 through which signals entering a bond pad 22 normally pass during non-test mode operations of the DRAM device 10, and enables a switching circuit 24. The bond pad 22 may be any bond pad that is not needed during testing, such as an unused address signal pad or a no-connection (NC) pad. Once enabled, the switching circuit 24 operates in response to the clock signal CLK by passing current $I_{CCP}$ from an external current source 26 attached to the bond pad 22 to the bus 12, thereby boosting the boosted voltage $V_{CCP}$ above its preset minimum.

Thus, the switching circuit 24 supports the increased demand on the boosted voltage $V_{CCP}$ during testing by providing the current $I_{CCP}$ from an external source. This allows the capacitors (not shown) of the charge pump 18 to be sized for the lesser demand on the boosted voltage $V_{CCP}$ experienced during normal memory operations rather than the increased demand experienced during test operations. As a result, less die "real estate" is used for the capacitors of the charge pump 18, so the DRAM device 10 can be manufactured on a smaller integrated circuit (IC) die, or more functional circuitry can be provided in the DRAM device 10.

Figure 2:
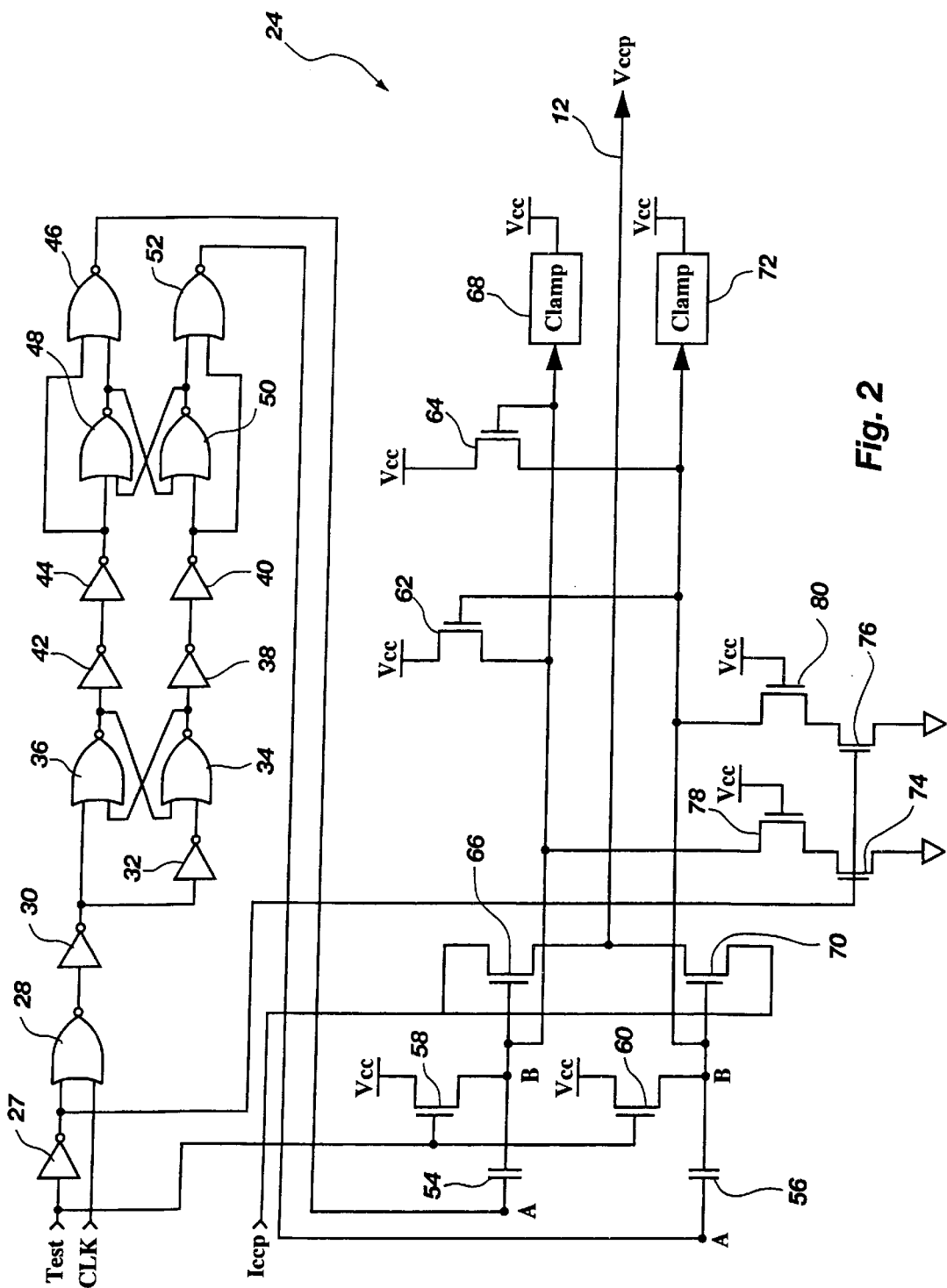
FIG. 2 is a schematic and block diagram of a switching circuit of the DRAM device of FIG. 1.

As shown in detail in FIG. 2, during testing, an active (i.e., high) test signal TEST enables the switching circuit 24 by causing an inverter 27 to output a low. Assuming, for the moment, a steady-state condition in which the clock signal CLK has not been activated by the ring oscillator 16 (FIG. 1), the low output by the inverter 27 causes a NOR gate 28 to output a high which, in turn, causes an inverter 30 to output a low and an inverter 32 to output a high. The high from the inverter 32 causes a NOR gate 34 to output a low which, when combined with the low from the inverter 30, causes a NOR gate 36 to output a high. The low from the NOR gate 34 causes an inverter 38 to output a high which, in turn, causes another inverter 40 to output a low, and the high from the NOR gate 36 causes an inverter 42 to output a low which, in turn, causes yet another inverter 44 to output a high. The high from the inverter 44 causes a NOR gate 46 and a NOR gate 48 to both output a low. The low from the NOR gate 48 and the low from the inverter 40 cause a NOR gate 50 to output a high which, in turn, causes a NOR gate 52 to output a low.

The lows output by the NOR gates 46 and 52 ground node "A" of capacitors 54 and 56. Meanwhile, the high test signal TEST activates NMOS transistors 58 and 60, thereby storing the supply voltage $V_{CC}$, less the threshold voltage $V_T$ of the transistors 58 and 60, on node "B" of the capacitors 54 and 56. Helper NMOS transistors 62 and 64 help to pull node "B" of the capacitors 54 and 56 up to $V_{CC}-V_T$.

Once the clock signal CLK is activated by the ring oscillator 16 (FIG. 1), a rising edge of the clock signal CLK flips the output of the NOR gate 28 to a low, causing the inverter 30 to output a high and the inverter 32 to output a low. The high from the inverter 30 causes the NOR gate 36 to output a low which, when combined with the low from the inverter 32, causes the NOR gate 34 to output a high. The low from the NOR gate 36 causes the inverter 42 to output a high and the inverter 44 to output a low, and the high from the NOR gate 34 causes the inverter 38 to output a low and the inverter 40 to output a high.

The low from the inverter 44 causes the NOR gate 46 to begin to output a high pulse. This high pulse lasts until the high output of the inverter 40 causes the NOR gate 50 to output a low, causing the NOR gate 48 to output a high and thereby driving the output of the NOR gate 46 low again. The output of the NOR gate 52 remains low on the rising edge of the clock signal CLK.

The high pulse from the NOR gate 46 raises node A of the capacitor 54 up to the supply voltage $V_{CC}$ during the pulse, which "boosts" the voltage on node B of the capacitor 54 up to $2V_{CC}-V_T$ (because $V_{CC}-V_T$ is already stored across the capacitor 54). This "boosted" voltage causes the NMOS transistors 58 and 62 to turn off, and turns on an NMOS transistor 66, allowing the transistor 66 to pass the external current $I_{CCP}$ through to the $V_{CCP}$ bus 12.

A conventional clamp 68 keeps the voltage on node B of the capacitor 54 from exceeding $V_{CC}+4V_T$, but it can, of course, be constructed to limit the node to any desired maximum voltage. Also, the boosted voltage on node B of the capacitor 54 causes the transistor 64 to pass a full supply voltage $V_{CC}$ level through to node B of the capacitor 56 for storage thereon.

With the clock signal CLK still activated, a falling edge of the clock signal CLK flips the output of the NOR gate 28 to a high, causing the inverter 30 to output a low and the inverter 32 to output a high. The high from the inverter 32 causes the NOR gate 34 to output a low which, when combined with the low from the inverter 30, causes the NOR gate 36 to output a high. The low from the NOR gate 34 causes the inverter 38 to output a high and the inverter 40 to output a low, and the high from the NOR gate 36 causes the inverter 42 to output a low and the inverter 44 to output a high.

The low from the inverter 40 causes the NOR gate 52 to begin to output a high pulse. This high pulse lasts until the high output of the inverter 44 causes the NOR gate 48 to output a low, causing the NOR gate 50 to output a high and thereby driving the output of the NOR gate 52 low again. The output of the NOR gate 46 remains low on the falling edge of the clock signal CLK.

The high pulse from the NOR gate 52 raises node A of the capacitor 56 up to the supply voltage $V_{CC}$ during the pulse, which "boosts" the voltage on node B of the capacitor 56 up to $2V_{CC}$ (because $V_{CC}$ is already stored across the capacitor 56). This "boosted" voltage causes the NMOS transistors 60 and 64 to turn off, and turns on an NMOS transistor 70, allowing the transistor 70 to pass the external current $I_{CCP}$ through to the $V_{CCP}$ bus 12.

A conventional clamp 72 keeps the voltage on node B of the capacitor 56 from exceeding $V_{CC}+4V_T$, but it can, of course, be constructed to limit the node to any desired maximum voltage. Also, the boosted voltage on node B of the capacitor 56 causes the transistor 62 to pass a full supply voltage $V_{CC}$ level through to node B of the capacitor 54 for storage thereon. As a result, subsequent operation of the switching circuit 24 periodically boosts node B of the capacitor 54 up to $2V_{CC}$, rather than $2V_{CC}-V_T$ as described above, because a full $V_{CC}$ level is now stored across the capacitor 54.

During normal operations of the DRAM device 10 (FIG. 1), the test signal TEST is low, which causes the inverter 27 to output a high, thereby turning on NMOS transistors 74 and 76, and pulling node B of the capacitors 54 and 56 to ground through NMOS transistors 74, 76, 78, and 80. As a result, the NMOS transistors 66 and 70 are off, and the $V_{CCP}$ bus 12 is isolated from the bond pad 22 (FIG. 1).

It should be understood that, as a group, the inverters 27, 30, 32, 38, 40, 42, and 44, and the NOR gates 28, 34, 36, 46, 48, 50, and 52, may be referred to generally as "pump control circuitry." It should also be understood that, as a group, the capacitor 54 and the NMOS transistor 58 may be referred to as a "pump circuit," and that, as a group, the capacitor 56 and the NMOS transistor 60 may also be referred to as a "pump circuit." Further, it should be understood that the NMOS transistors 66 and 70 may be referred to as "switches."

Figure 3:
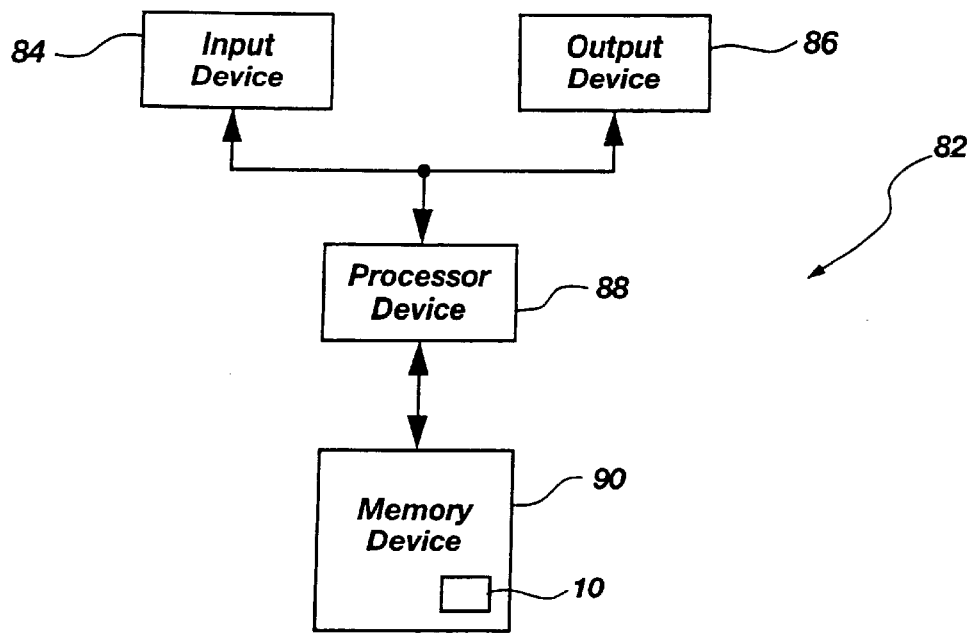
FIG. 3 is a block diagram of an electronic system incorporating the DRAM of FIG. 1.

As shown in FIG. 3, an electronic system 82 includes an input device 84, an output device 86, a processor device 88, and a memory device 90 incorporating the DRAM device 10 of FIG. 1. Of course, any one of the input, output, and processor devices 84, 86, and 88 can also incorporate the DRAM device 10.

Figure 4:
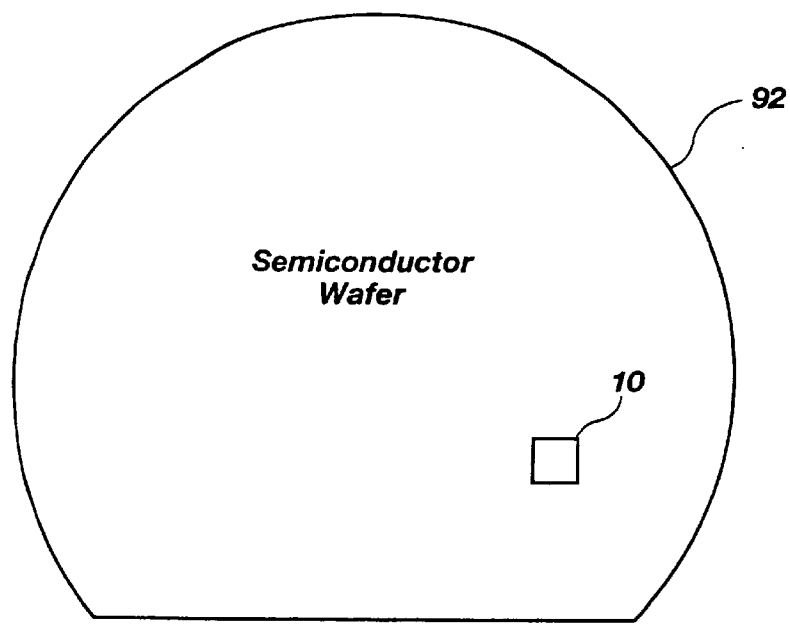
FIG. 4 is a diagram of a semiconductor wafer having a surface on which the DRAM of FIG. 1 is fabricated.

As shown in FIG. 4, the DRAM device 10 of FIG. 1 is fabricated on the surface of a semiconductor wafer 92. However, the DRAM device 10 may also be manufactured on a wide variety of semiconductor substrates other than a semiconductor wafer including, for example, a Silicon on Sapphire (SOS) substrate, a Silicon on Glass (SOG) substrate, and a Silicon on Insulator (SOI) substrate.

Although this invention has been described with reference to particular embodiments, the invention is not limited to these described embodiments. Rather, the invention is limited only by the appended claims, which include within their scope all equivalent devices and methods that operate according to the principles of the invention as described.

What is claimed is:

1. A wafer comprising:
   at least one semiconductor die including:
      a conductor configured to distribute a boosted voltage within the at least one semiconductor die;
      internal boosting circuitry operably coupled to the conductor and configured to boost a voltage level on the conductor upon sensing that the voltage level has fallen below a minimum level;
      a terminal configured to receive current from a current source external to the at least one semiconductor die; and
      a switching circuit operably coupled to the conductor, the internal boosting circuitry, and the terminal, the switching circuit configured to conduct current received through the terminal to the conductor in response to the internal boosting circuitry sensing that the voltage level on the conductor has fallen below the minimum level.

2. The wafer of claim 1, wherein the conductor comprises a boosted voltage bus.

3. The wafer of claim 1, wherein the internal boosting circuitry comprises a voltage regulator, a ring oscillator, and a charge pump.

4. The wafer of claim 1, wherein the terminal comprises at least one bond pad.

5. The wafer of claim 4, wherein the at least one bond pad comprises at least one of a no-connection bond pad and an address signal bond pad.

6. The wafer of claim 1, wherein the switching circuit comprises pump control circuitry, at least two pump circuits, at least two switches, and at least two clamps.

7. The wafer of claim 6, wherein the pump control circuitry, switches, and pump circuits together comprise a plurality of inverters, NOR gates, capacitors, and NMOS transistors.

8. A wafer comprising:
   at least one memory device including:
      a conductor configured to distribute a boosted voltage within the at least one memory device;
      internal boosting circuitry operably coupled to the conductor and configured to boost a voltage level on the conductor upon sensing that the voltage level has fallen below a minimum level;
      a terminal configured to receive current from a current source external to the at least one memory device; and
      a switching circuit operably coupled to the conductor, the internal boosting circuitry, and the terminal, the switching circuit configured to conduct current received through the terminal to the conductor in response to the internal boosting circuitry sensing that the voltage level on the conductor has fallen below the minimum level.

9. The wafer of claim 8, wherein the at least one memory device comprises a Dynamic Random Access Memory (DRAM) device.

10. A semiconductor substrate comprising:
    at least one Dynamic Random Access Memory (DRAM) device, said at least one DRAM device comprising:
       a boosted voltage bus;
       a voltage regulator operably coupled to the boosted voltage bus and configured to sense whether a boosted voltage has fallen below a minimum level;
       a ring oscillator operably coupled to the voltage regulator and configured to output a clock signal in response to the voltage regulator sensing that the boosted voltage has fallen below the minimum level;
       a charge pump operably coupled to the ring oscillator and the boosted voltage bus, the charge pump configured to boost the boosted voltage in response to the clock signal;
       a bond pad configured to receive current from a current source external to the at least one DRAM device; and
       a switching circuit operably coupled to the boosted voltage bus, the ring oscillator, and the bond pad and configured to conduct current received through the bond pad to the boosted voltage bus in response to the clock signal.

11. The semiconductor substrate of claim 10, wherein said semiconductor substrate is formed from at least one of a silicon on sapphire substrate, a silicon on glass substrate and a silicon on insulator substrate.

12. A semiconductor wafer having multiple semiconductor dice interconnected in rows and columns, said wafer comprising:
    at least one semiconductor device including:
       internal boosting circuitry operably coupled to a conductor; and
       a terminal operably coupled to a point external to the at least one semiconductor device and configured to conduct current received through the terminal to the conductor in response to the internal boosting circuitry sensing that a voltage on the conductor has fallen below a minimum level.

13. The semiconductor wafer of claim 12, further comprising a switching circuit operably coupled to the terminal and the conductor, the switching circuit configured to conduct the current received through the terminal to the conductor.

14. The semiconductor wafer of claim 13, further comprising an input buffer associated with the terminal and configured to communicate signals to at least one predetermined region of the at least one semiconductor device during normal operation.

15. The semiconductor wafer of claim 12, wherein the conductor comprises a boosted voltage bus.

16. The semiconductor wafer of claim 12, wherein the internal boosting circuitry comprises a voltage regulator, a ring oscillator, and a charge pump.

17. The semiconductor wafer of claim 12, wherein the terminal comprises a bond pad.

18. The semiconductor wafer of claim 17, wherein the bond pad comprises at least one of a no-connection bond pad and an address signal bond pad.

19. The semiconductor wafer of claim 13, wherein the switching circuit comprises pump control circuitry, at least two pump circuits, at least two switches, and at least two clamps.

* * * * *